United States Patent
Ho et al.

(10) Patent No.: US 12,022,640 B1
(45) Date of Patent: Jun. 25, 2024

(54) MULTI-COLUMN GRAPHITE-OVER-FOAM ASSEMBLY

(71) Applicant: Cisco Technology, Inc., San Jose, CA (US)

(72) Inventors: Phong Hoang Ho, Cary, NC (US); Stephen Aubrey Scearce, Apex, NC (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 4 days.

(21) Appl. No.: 17/840,268

(22) Filed: Jun. 14, 2022

Related U.S. Application Data

(60) Provisional application No. 63/277,222, filed on Nov. 9, 2021.

(51) Int. Cl.
  *H05K 7/20* (2006.01)
  *H05K 9/00* (2006.01)

(52) U.S. Cl.
  CPC ......... *H05K 9/0022* (2013.01); *H05K 7/2049* (2013.01); *H05K 7/2039* (2013.01); *H05K 7/20454* (2013.01)

(58) Field of Classification Search
  CPC .. H05K 9/0022; H05K 7/2049; H05K 7/2039; H05K 7/20454
  USPC .......................................................... 361/752
  See application file for complete search history.

(56) References Cited

U.S. PATENT DOCUMENTS

| | | | | |
|---|---|---|---|---|
| 11,483,948 B2* | 10/2022 | Strader | ............... | H05K 7/20454 |
| 2003/0193794 A1* | 10/2003 | Reis | ....................... | H05K 9/003 |
| | | | | 257/E23.114 |
| 2003/0227750 A1* | 12/2003 | Glovatsky | .......... | H05K 7/20454 |
| | | | | 361/699 |
| 2005/0045358 A1* | 3/2005 | Arnold | ................... | H05K 9/003 |
| | | | | 174/51 |
| 2005/0180113 A1* | 8/2005 | Shirakami | ........... | F28D 15/0233 |
| | | | | 257/E23.09 |

(Continued)

FOREIGN PATENT DOCUMENTS

| CN | 209806298 U | * 12/2019 | ........... H05K 7/2039 |
|---|---|---|---|
| CN | 209806298 U | 12/2019 | |

(Continued)

OTHER PUBLICATIONS

"Graphite over Foam (GOF)," Laird A Dupont Business, retrieved from the Internet Nov. 22, 2021, 1 page; https://www.laird.com/products/multi-function-solutions-mfs-ise-integrated-solutions-engineered/hybrid-ise/graphite-over-foam-gof.

(Continued)

*Primary Examiner* — Zhengfu J Feng
(74) *Attorney, Agent, or Firm* — Edell, Shapiro & Finnan, LLC

(57) ABSTRACT

A multi-column graphite-over-foam (GOF) assembly includes a plurality of foam columns wherein each foam column of the plurality of foam columns are individually wrapped in a graphite sheet. A graphite layer surrounds the plurality of foam columns and an electrically conductive outer layer surrounding the graphite layer. The graphite layer is configured to thermally couple the electrically conductive outer layer to the plurality of foam columns, and the electrically conductive outer layer is configured to absorb electromagnetic interference (EMI).

20 Claims, 5 Drawing Sheets

(56) References Cited

U.S. PATENT DOCUMENTS

| | | | |
|---|---|---|---|
| 2011/0162879 A1* | 7/2011 | Bunyan | H05K 9/003 174/378 |
| 2014/0078677 A1* | 3/2014 | Dolci | H05K 9/0032 361/720 |
| 2014/0268578 A1* | 9/2014 | Dolci | H05K 7/20436 361/721 |
| 2015/0201533 A1* | 7/2015 | Daughtry, Jr. | H05K 9/0032 29/840 |
| 2015/0266146 A1 | 9/2015 | Ofoma et al. | |
| 2016/0037692 A1* | 2/2016 | Zhang | H05K 9/0024 174/394 |
| 2017/0367175 A1* | 12/2017 | Lai | H05K 1/0203 |
| 2018/0199460 A1 | 7/2018 | Wu | |
| 2021/0068304 A1 | 3/2021 | Strader et al. | |

FOREIGN PATENT DOCUMENTS

| | | | |
|---|---|---|---|
| CN | 214012524 U * | 8/2021 | F16J 15/022 |
| WO | 2018164671 A1 | 9/2018 | |

OTHER PUBLICATIONS

"Thermal Foam Gasket (TFG)," E-Song EMC, retrieved from Internet Jun. 14, 2022, 8 pages; https://esongemc.com/eng/page/product/m03/Thermal_Foam_Gasket.php.

"High Thermal Conductive Graphite Sheet Preliminary," Laird Tech, Tgon 9000, THR-DS-TGON 9000 032415, http://assets.lairdtech.com/home/brandworld/files/THR-DS-TGON_9000_032415.pdf, Dec. 18, 2018, 2 pages.

* cited by examiner

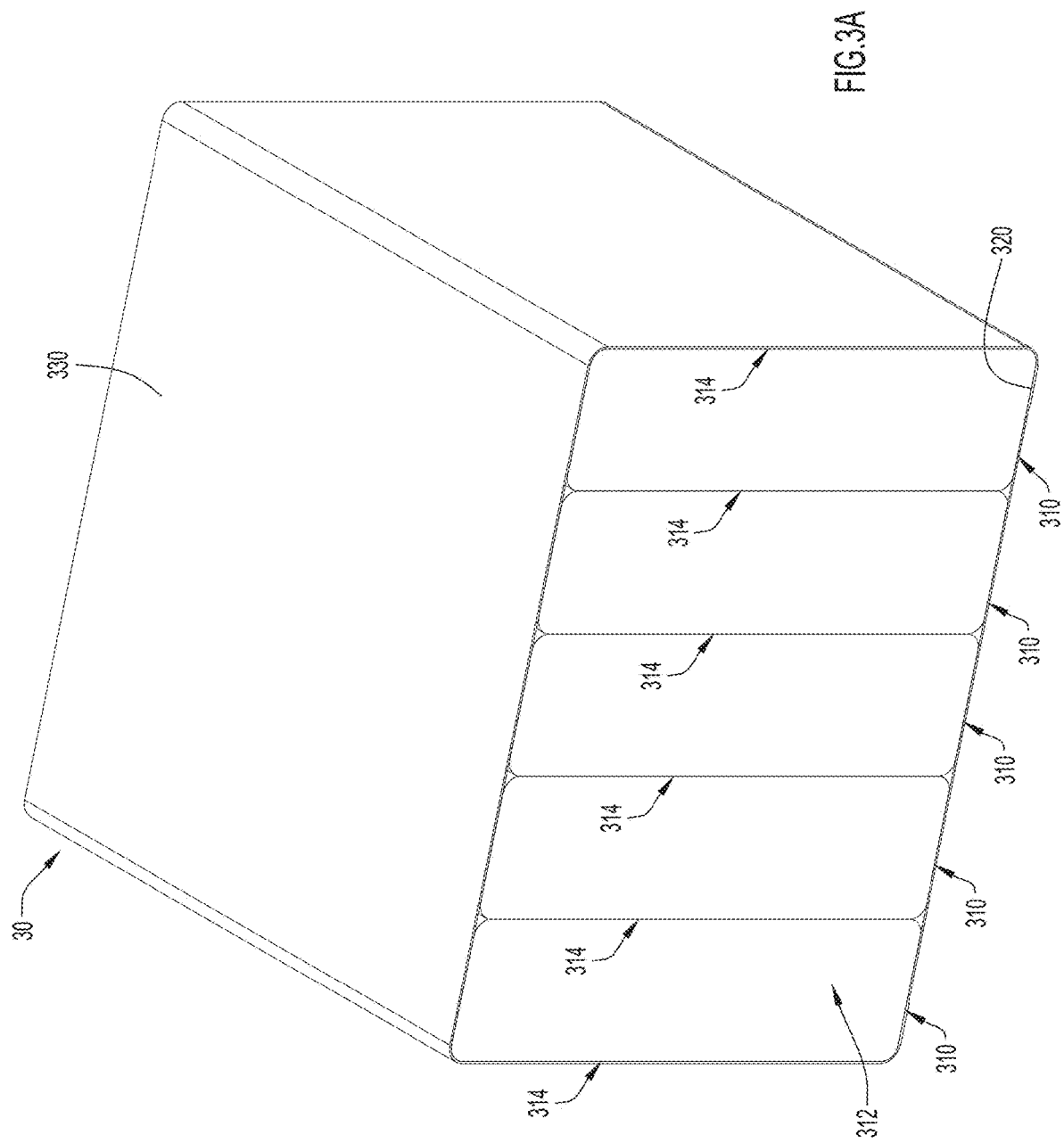

MULTI-COLUMN GRAPHITE-OVER-FOAM ASSEMBLY

CROSS REFERENCE TO RELATED APPLICATION

This application claims priority to U.S. Provisional Application No. 63/277,222, filed Nov. 9, 2021, the entirety of which is incorporated herein by reference.

TECHNICAL FIELD

The present disclosure relates to assemblies for thermal management and electromagnetic compatibility of heat sources, in particular, multi-column graphite-over-foam assemblies.

BACKGROUND

Computing components such as central processing units ("CPU"), switches, field-programmable gate arrays ("FGA"), network processing units ("NPU"), or other integrate circuits ("IC") require thermal management for heat removal, as well as electromagnetic compatibility ("EMC") shielding/grounding to avoid radiated emission (e.g., electromagnetic interference or "EMI") coupling onto system and radiating out into the external environment. This involves many parts such as a thermal interface, a heatsink, and EMC gaskets and/or a shield. Thus, providing proper thermal management can result into design complexity and high cost. Generally, conventional thermal interface materials do not provide EMI or EMC shielding.

BRIEF DESCRIPTION OF THE DRAWINGS

FIG. 3A is a perspective view of a multi-column GOF of the networking device of FIG. 2.

DESCRIPTION OF EXAMPLE EMBODIMENTS

Overview

Briefly, a multi-column graphite-over-foam (GOF) assembly is provided that includes a plurality of foam columns, wherein each foam column of the plurality of foam columns are individually wrapped in a graphite sheet. A graphite layer surrounds the plurality of foam columns, and an electrically conductive outer layer surrounds the graphite layer. The graphite layer is configured to thermally couple the electrically conductive outer layer to the plurality of foam columns, and the electrically conductive outer layer is configured to absorb electromagnetic interference (EMI).

EXAMPLE EMBODIMENTS

Figure 4A:
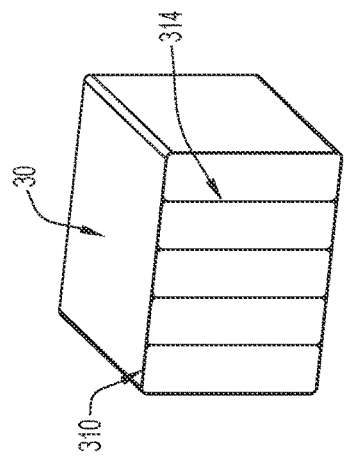
FIG. 4A is a perspective view of a conventional GOF assembly.
Figure 4B:
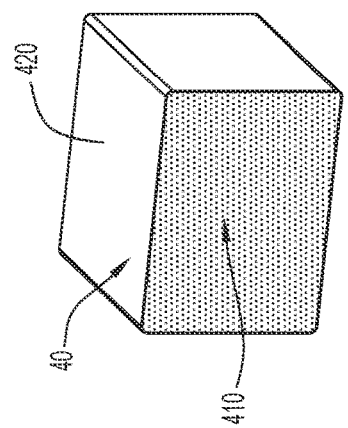
FIG. 4B is a perspective view of the multi-column GOF assembly of FIG. 3A.

A conventional graphite-over-foam ("GOF") thermal interface material ("TIM"), or thermal foam gasket includes a single foam core surrounded by a graphite sheet (see FIG. 4A). The graphite sheet has a high thermal conductance, but it is very thin. The graphite sheet properties include heat conduction resistance, limiting the effectiveness of the heat dissipation. The conduction resistance (R) is equal to a length (L) of the graphite sheet divided by the product of the thermal conductivity (k) and cross-sectional area (A) of the graphite sheet. Thus, a conduction resistance (R) of a sheet of graphite may be calculated based on the following equation:

$$R = L/kA.$$

For example, wrapping a graphite sheet around a foam core to conduct heat away from a heat source results in a long travel distance (e.g., the perimeter of the assembly). Based on the equation above, increasing a length (L) through which the heat must be conducted (e.g., the perimeter of the GOF assembly) results in an increase in the conduction resistance. Therefore, the long travel distance or length (L) increases the overall heat conduction resistance of the graphite sheet. Consequently, the conventional GOF assembly absorbs more heat than it can conduct and dissipate. Thus, the thermal effectiveness of the conventional GOF assembly is limited by the size of the assembly or the amount of heat it can effectively remove.

Generally, the techniques described herein relate to a multi-column graphite-over-foam ("GOF") assembly for conducting heat from a heat source to a heatsink. The heatsink may be disposed on a chassis or housing. The GOF assembly comprises a plurality of columns, each column includes a foam core individually wrapped in a graphite sheet/layer. The plurality of columns is wrapped in a second graphite layer. That is, the second graphite layer surrounds the plurality of columns. The GOF assembly further includes a conductive layer/wrap that surrounds the second graphite layer.

The multi-column GOF assembly presented herein provides a lower conduction resistance by conducting heat through the sheets between the foam cores to reduce the distance the heat must travel while increasing the surface area of the graphite through which the heat is conducted. For example, the second graphite layer spreads heat from the heat source to the columns of the GOF assembly to distribute the heat to the columns. The graphite sheet of each column then conducts the heat through the GOF assembly, away from the heat source, and towards a heatsink. Thus, the multi-column GOF has more surface area to conduct the heat over a smaller distance as compared to the conventional GOF assembly with just an outer graphite wrap. Therefore, the thermal efficiency of the multi-column GOF assembly is improved as compared to conventional GOF assemblies.

Meanwhile, the outer electrically conductive layer can block electromagnetic interference ("EMI") radiating from the heat source. For example, the outer electrically conductive layer may absorb EMI radiated from the heat source and conduct the EMI to the nearest ground to meet a desired EMC level. The ground may be disposed in the chassis/housing lid and/or a printed circuit board ("PCB"), e.g., ground pins surrounding the heatsink. For example, the outer conductive layer may be in contact with or otherwise electrically coupled to a ground in the chassis, lid, and/or PCB.

Accordingly, the techniques presented herein provide a multi-column GOF assembly that has a lower conduction resistance as compared to a conventional GOF assembly, and shields EMI emanating from a heat source. Further, the multi-column GOF assembly may replace a heatsink and/or EMI/EMC shield, while a TIM (e.g., thermal paste, gap pad, gel, etc.) can be omitted.

Figure 1:
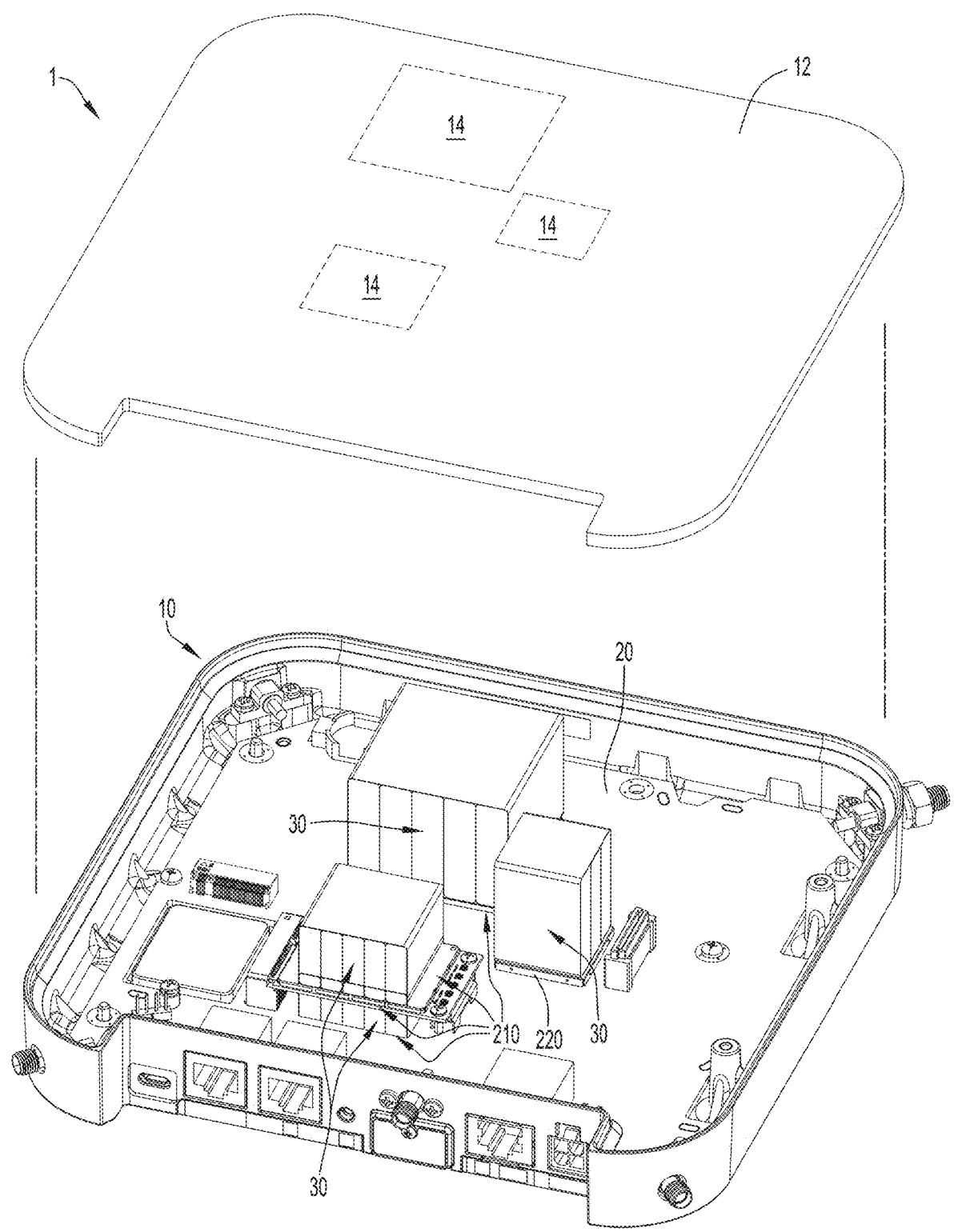
FIG. 1 is a partially exploded perspective view of a networking device having multi-column graphite-over-foam (GOF) assemblies according to an example embodiment.

With reference made to FIG. 1, a partially exploded, perspective view of a network component 1 is illustrated. The network component 1 (which may be any computing, electronic device, etc. that generates heat and EMI) includes a chassis or housing 10 having a lid 12. The chassis 10 further includes a PCB 20 comprising a plurality of heat sources 210 (e.g., integrated circuits, chips, dies etc.) and an EMI shield 220. Compressible multi-column GOF assemblies 30 are disposed on the plurality of heat sources 210 and/or EMI or EMC shields 220. The GOF assemblies 30 are configured to be compressed between the lid 12 and the heat source 210 and/or EMI shields 220. The EMI shields 220 block lateral radiation of EMI from the heat sources 210, while the GOF assemblies 30 block EMI emanating vertically through the chassis 10. An inner surface of the lid 12 includes a plurality of grounds 14 configured to ground electric currents (e.g., generated by EMI) and absorb heat from the GOF assemblies 30. That is, the grounds 14 may also serve as heatsinks for heat sources 210 in the housing 10. For example, heat may be generated by the heat sources 210, and conducted through the GOF assemblies 30 to the grounds 14. Similarly, EMI (e.g., an electric field or current) may be generated by the heat sources 210 and conducted through the GOF assemblies 30 to the grounds 14. Although three independent grounds 14 are shown, embodiments are not limited thereto. In some implementations, the grounds 14 may be electrically and/or thermally coupled to one another. In another implementation, the lid 12 may include a single ground sized to contact all the GOF assemblies 30. In yet another implementation, the multi-column GOF assemblies 30 may serve as a heatsink and dissipate the heat generated by the heat sources 210.

Figure 2:
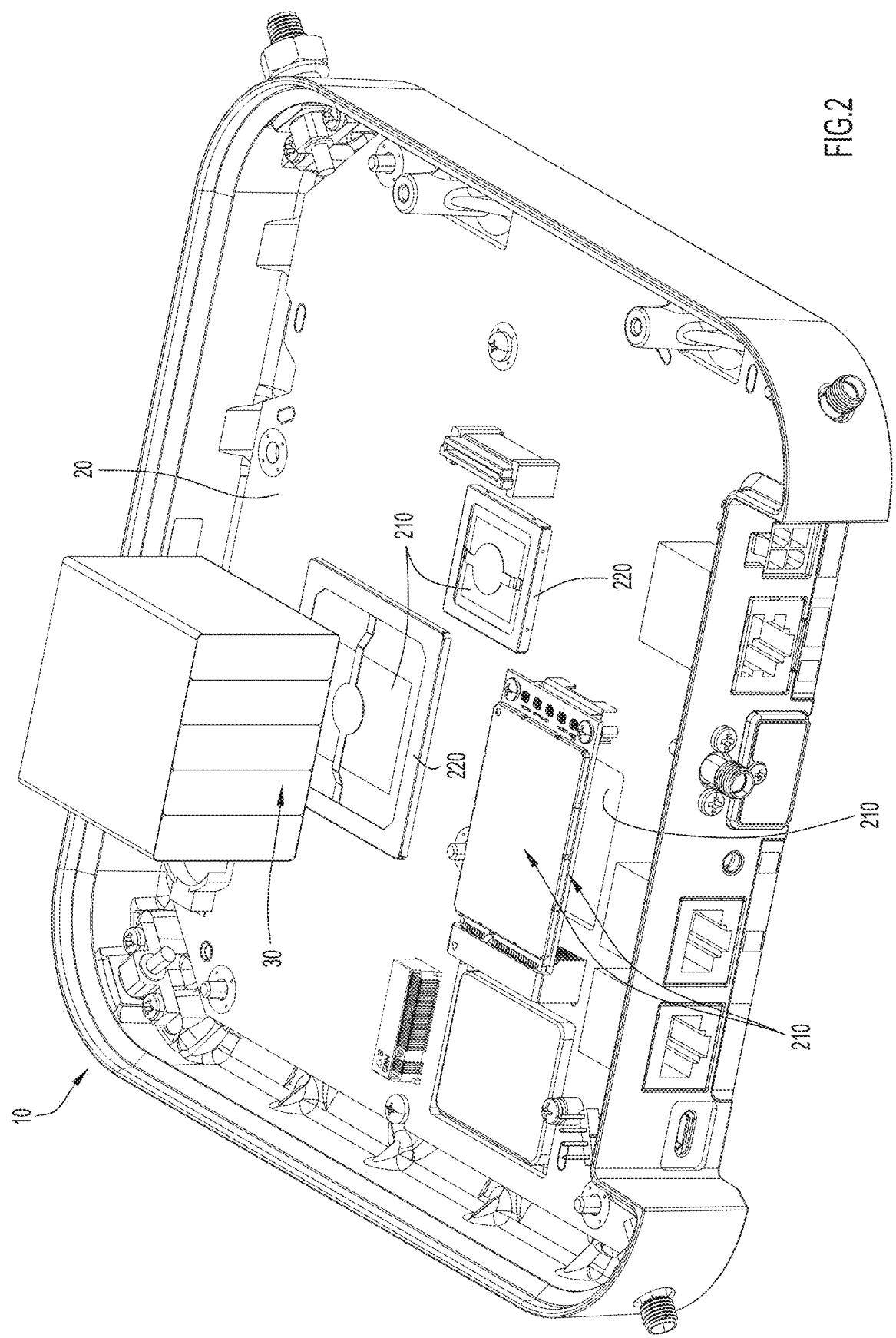
FIG. 2 is a partially exploded view of a chassis of the networking device of FIG. 1.

Now referring to FIG. 2, with continued reference to FIG. 1, a partially exploded view of the chassis 10 is illustrated. As depicted in FIG. 2, a GOF assembly 30 is shown separated from the chassis 10, above a heat source 210, and two of the GOF assemblies 30 and the lid 12 are omitted to clearly illustrate the heat sources 210 and EMI shields 220. Each EMI shield 220 is mounted to grounding pins of the PCB 20 surrounding each heat source 210. The EMI shields 220 absorb EMI emanating from the lateral sides of the heat sources 210 and conducts the EMI to the grounding pins of the PCB.

The multi-column GOF assemblies 30 absorb heat and EMI emanating, or radiating, from the heat sources 210 and conduct the heat to the lid 12 and the EMI to a ground 14 disposed in the lid 12 and/or the EMI shield 220. In some implementations, EMI shields 220 may be omitted, and the GOF assembly 30 may be compressed to surround a heat source 210 and to contact the grounding pins of PCB. Consequently, the GOF assemblies 30 may absorb EMI radiating vertically and/or laterally from the heat source 210 and conduct the EMI to grounding pins in the PCB and/or the grounds 14 in the lid 12.

Figure 3B:
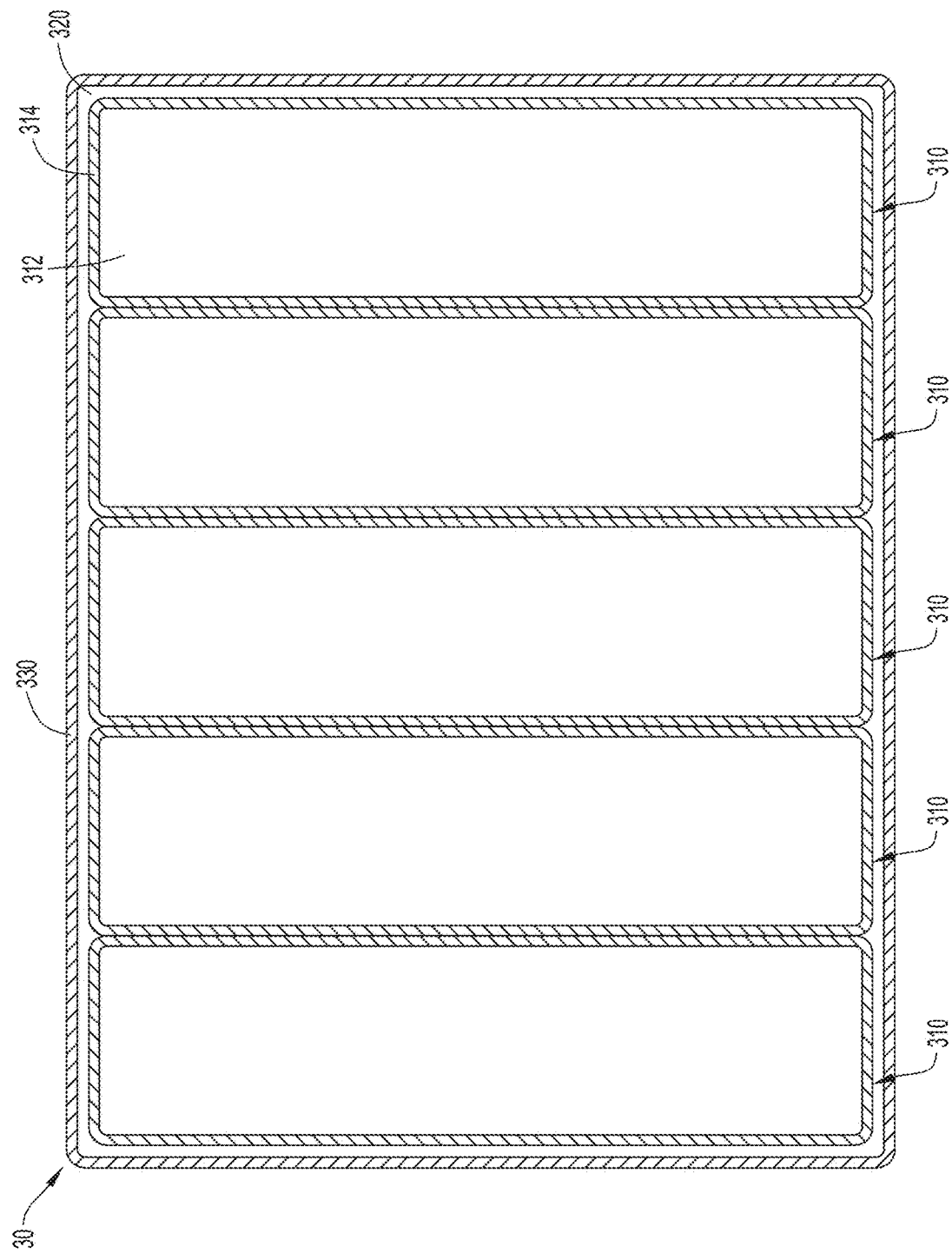
FIG. 3B is a front view of the multi-column GOF of FIG. 3A.

Now referring to FIGS. 3A and 3B, the GOF assembly 30 is depicted. FIG. 3A shows a front perspective view of the GOF assembly 30 and FIG. 3B is a front view of the GOF assembly 30. The GOF assembly 30 comprises a plurality of compressible foam columns 310, a graphite wrap 320 surrounding the foam columns 310, and an electrically-conductive wrap/layer 330 wrapping the graphite wrap 320 and foam columns 310. Each foam column 310 includes a compressible foam core 312 wrapped in a flexible graphite sheet 314. That is, the foam cores 312 are individually wrapped in graphite sheets 314 to define the foam columns 310, and the foam columns 310 are collectively wrapped in the graphite wrap 320 and the electrically conductive layer 330. Said yet another way, the GOF assembly 30 comprises the compressible foam cores 312 covered with three flexible layers. For example, each core 312 is covered by a first layer defined by the graphite sheets 314 to form the foam column 310. A second (outer) layer defined by the graphite wrap 320 covers the plurality of columns 310, and a third (outermost) layer comprises the electrically conductive (outer) layer 330. In some implementations, the second graphite layer (e.g., graphite wrap 320) may be omitted such that the electrically conductive layer 330 wraps the plurality of foam columns 310. The electrically conductive layer 330 of the multi-column GOF assembly 30 may be made of copper, gold, silver, aluminum, or other electrically conductive material, In the depicted embodiment, the multi-column GOF assembly 30 provides an increased cross-sectional area of graphite layers extending or traversing through the GOF assembly 30 rather than around the perimeter of the GOF assembly 30. The plurality of graphite layers (e.g., graphite sheets 314) extending vertically between each foam core 312, and the graphite wrap 320 surrounding the outer periphery of the plurality of graphite wrapped columns 310 increases the surface area of graphite layers extending vertically through the GOF assembly 30 (rather than solely around its perimeter).

The cross-sectional area of the graphite layers extending through the GOF assembly 30 provides a low conduction resistance, as compared to conventional GOF assemblies. The conduction resistance of the depicted multi-column GOF assembly may be determined based on the following equation:

$$R=L/(k*xA), \text{ where } x=\text{number of columns plus graphite wraps.}$$

Based on this equation, increasing the surface area (A) of the graphite layers (e.g., graphite sheets 314 extending vertically through the GOF assembly 30 and graphite wrap 320) decreases the conduction resistance (R). Additionally, a distance (L) of a thermal path between a heated side (e.g., side adjacent to a heat source) and a cooled side (e.g., side adjacent to a heatsink) of the multi-column GOF assembly may be reduced as compared to a conventional GOF assembly with a thermal path extending along its perimeter. Hence, the more vertical graphite layers included in the GOF assembly 30, the lower the conduction resistance of the GOF assembly 30. Consequently, the conduction resistance of the GOF assembly 30 is significantly reduced as compared to conventional GOF assemblies.

The GOF assembly 30 is configured to be compressed between the heat source 210 and the lid 12 to provide strong thermal contact to the heat source 210 and the lid 12. Generally, TIMs and/or heatsinks apply compressive forces to a heat source 210 to improve heat transfer therebetween. The compressive forces may be a source of stress or strain on components of the heat source 210 or component on the chassis 10 holding the heat source 210. The GOF assembly 30 is compressible due to the compressibility of the foam cores 312 and flexibility of the layers (e.g., graphite sheet 314, graphite wrap 320, and electrically conductive layer 330). The compressibility of the foam columns 310 allows the GOF assembly 30 to be pressed into contact with grounds, heat sources 210, and heatsinks without introducing excess stress or strain on components of the network component 1. Accordingly, strong thermal contact may be made between the GOF assembly 30 and the heat source 210 and/or heatsink (e.g., lid 12 and/or ground 14) with less compressive force as compared to conventional heatsink assemblies and TIMs. Consequently, the GOF assembly 30 minimizes the stress and the strain on components of the chassis 10 including the heat source 210 and/or heatsink while providing desired heat transfer rates. Moreover, the compressibility of the GOF assembly 30 allows for serviceability of components within the chassis 10 without destroying the GOF assemblies 30 or requiring removal/application of a TIM (e.g., thermal paste, gap pad, gel, adhesive, etc.). That is, conventional TIMs are not required due to the strong thermal contact between the heat source 210 and the GOF assembly 30.

Referring to FIG. 3B with reference to FIGS. 1 and 2, during operation, the electrically conductive layer 330 absorbs EMI and heat emanating from or emitted by a heat source 210. The electrically conductive layer 330 conducts the EMI to the ground (e.g., grounding pins in the PCB and/or ground 14 in the lid 12 of the chassis 10). That is, the electrically conductive layer 330 minimizes an electric field potential emanating from the heat source 210 and can short the electric field to the nearest ground (e.g., at the PCB, the chassis, the lid, etc.). Thus, the multi-column GOF assembly 30 provides EMC shielding when used with an open-frame or contact point on the PCB for grounding, or to provide conductive path to the chassis 10 of the network component 1. In some implementations, each surface of the multi-column GOF assembly 30 is covered with the electrically conductive layer 330. In some implementations, any desired surface of the GOF assembly 30 may be covered with the electrically conductive layer 330. In some implementations, the electrically conductive layer 330 may be thermally conductive.

Meanwhile, heat is conducted from the heat source 210 to the graphite wrap 320. The graphite wrap 320 evenly spreads or distributes the heat to each of the columns 310. The foam columns 310 conduct the heat along the graphite sheets 314 towards a cool side of the GOF assembly 30, opposite a heated side. The foam columns 310 dissipate the received heat or transfer it to a heatsink thermally coupled to the GOF assembly 30. In some implementations, the graphite wrap 320 may be omitted, and the electrically conductive layer 330 may wrap and thermally couple the plurality of columns 310 and spread or distribute heat from the heatsink to the foam columns 310 while absorbing EMI from a heat source.

In the depicted embodiment, the multi-core GOF assembly 30 is generally rectangular, and the electrically conductive layer 330 is disposed on four sides (e.g., top, bottom, right and left sides) of the GOF assembly 30. However, the GOF assembly 30 may be sized and shaped in any manner to fit a particular component with any number of foam columns 310 to achieve desired thermal and EMC properties. For example, the GOF assembly 30 may be any shape and have any number of foam columns 310 configured to extend between a heat source and a heatsink. Moreover, the dimensions of the GOF assembly 30 may be set such that the GOF assembly is taller, shorter, longer, and/or wider to fit any desired electrical component. In some implementations, the electrically conductive layer 330 surrounds an entirety of the GOF assembly 30. That is, every side (e.g., top, bottom, right, left, front and back sides) of the GOF assembly 30 is covered with the electrically conductive layer 330. In some implementations, only one side of the GOF assembly (e.g., a side contacting the heat source 210 or other source of EMI) includes the electrically conductive layer and conducts absorbed EMI to an EMI shield or to the grounding pins in the PCB 20. Additionally, in some implementations, the foam cores 312 may include metallic particles to shield EMI from radiating through the GOF assembly 30.

Now referring to FIGS. 4A-4D, thermal performance of a conventional GOF assembly 40 (depicted in FIGS. 4A and 4C) and the multi-column GOF assembly 30 (depicted in FIGS. 4B and 4D) are illustrated for comparison. The conventional GOF assembly 40 comprises a foam core 410 surrounded by a graphite layer 420. The graphite layer 420 is configured to conduct heat from a heat source 212 disposed on a PCB 200, around the perimeter of the conventional GOF assembly 40, to a heatsink 50. Conversely, as noted above, the multi-column GOF assembly 30 provides a plurality of foam columns 310 having graphite sheets 314 aligned to extend between the heat source 212 of a PCB 202 and the heatsink 52. Therefore, the heat from the heat source 214 can be conducted through the multi-column GOF assembly 30 along the plurality of layers (e.g., the graphite sheets 314, the graphite wrap 320, and the electrically conductive layer 330). Consequently, the heat conduction resistance is significantly reduced as compared to the conventional GOF assembly 40.

Figure 4C:
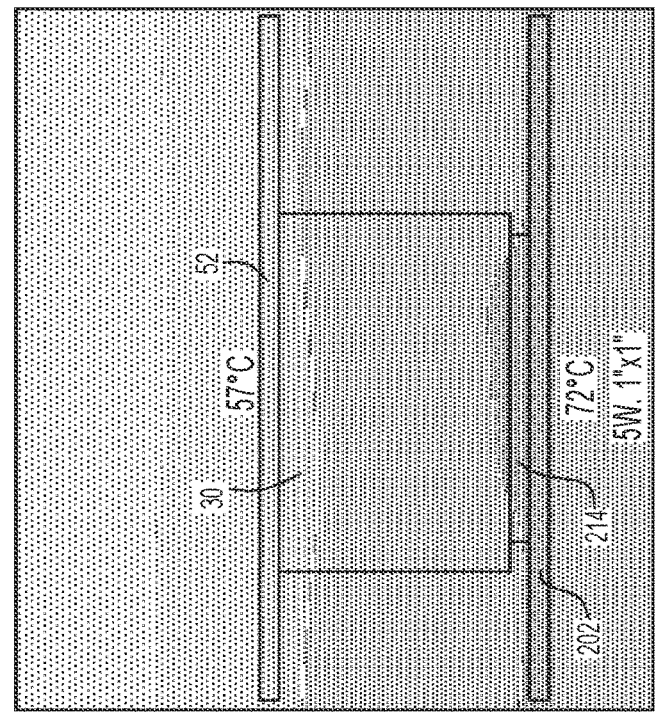
FIG. 4C is a heat map corresponding to the conventional GOF assembly of FIG. 4A.
Figure 4D:
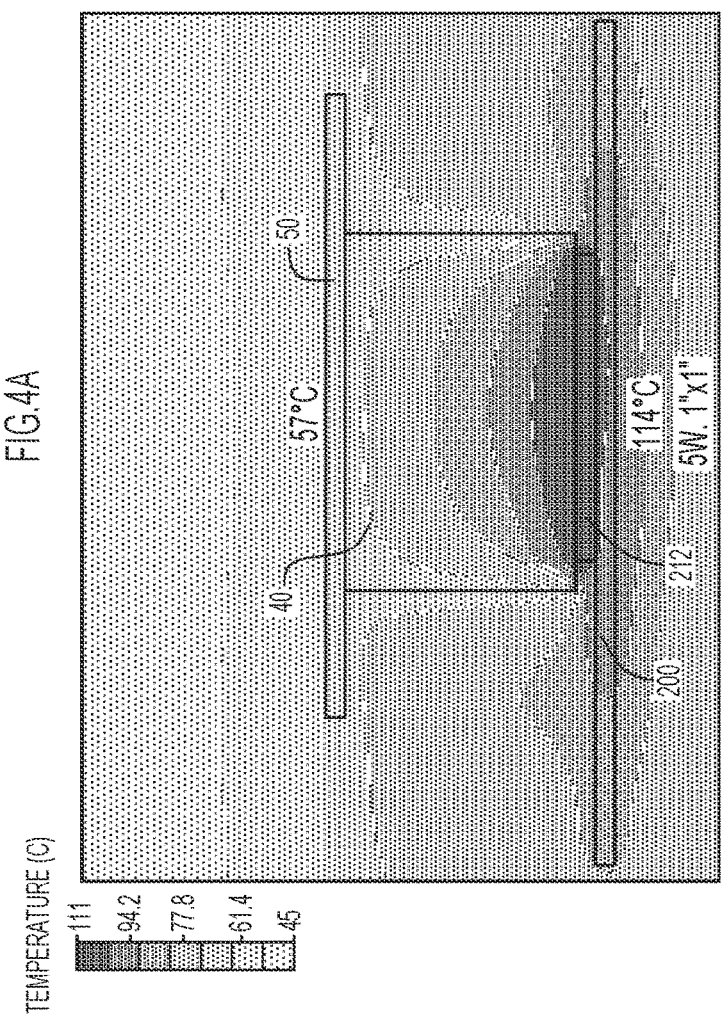
FIG. 4D is a heat map of the multi-column GOF assembly of FIG. 4B.

As depicted in FIGS. 4C and 4D, the conventional GOF assembly 40 and the multi-column GOF assembly 30 are each thermally coupled to a 5 Watt, 1-inch by 1-inch heat source 212, 214 on a first side of each assembly, and a heatsink 50, 52 on a second side of each assembly 40, 30, opposite the first side. The heatsinks 50, 52 are maintained at 57° C. As shown in FIG. 4D, the multi-column GOF assembly 30 dissipates the heat generated by the heat source 214 and maintains the heat source 214 at a temperature of about 72° C. Meanwhile, as shown in FIG. 4A, the conventional GOF assembly 40 dissipates less heat than the multi-column GOF assembly 30, resulting in the heat source 212 maintaining a higher temperature of 114° C. Thus, the lower conductive resistance of the multi-column GOF assembly 30 results in better heat transfer and thermal efficiency as compared to conventional GOF assemblies 40.

Accordingly, the multi-column GOF assembly 30 as described herein has multiple foam cores covered with graphite layers and a thermally/electrically conductive layer on a bottom surface, one or more surfaces, and/or all sides of the GOF assembly 30. The techniques presented herein provide scalable thermal performance with effective EMI shielding. For example, adding more columns increases the number of thermal paths between the heat source and the heat sink. The graphite wrap covering the plurality of columns provides a uniform temperature distribution across the multi-column GOF assembly 30. Therefore, the GOF assembly provides improved thermal conduction and EMI shielding in an all-in-one solution. Consequently, a single multi-core GOF assembly 30 can replace or serve as a substitute for many conventional parts includes a heatsink, EMC gaskets, and TIMs.

The multi-column GOF assembly 30 presented herein provides an efficient and very low-cost solution because one GOF assembly 30 can be replace a plurality of parts such as TIMs, EMC gaskets, EMI/EMC shields, and, potentially, the heatsink. All these parts add to cost and weight. Thus, the techniques presented herein provide a low-cost solution sufficient to provide desired thermal and EMC properties.

In some aspects, the techniques described herein relate to a multi-column graphite-over-foam (GOF) assembly including: a plurality of foam columns, each foam column of the plurality of foam columns being individually wrapped in a graphite sheet; a graphite layer surrounding the plurality of foam columns; and an electrically conductive outer layer surrounding the graphite layer, wherein the graphite layer is configured to thermally couple the electrically conductive outer layer to the plurality of foam columns, and wherein the electrically conductive outer layer is configured to absorb electromagnetic interference (EMI).

In some aspects, the techniques described herein relate to an assembly, wherein the electrically conductive outer layer is configured to surround a heat source and electrically couple a printed circuit board (PCB) to a chassis housing.

In some aspects, the techniques described herein relate to an assembly, wherein the GOF assembly is configured to be compressed between the heat source and a lid of the chassis housing.

In some aspects, the techniques described herein relate to an assembly, wherein the GOF assembly conducts heat and the EMI from the heat source to the chassis housing.

In some aspects, the techniques described herein relate to an assembly, wherein the electrically conductive outer layer electrically couples to a PCB through contacts surrounding a heat source and/or an EMI shield surrounding the heat source.

In some aspects, the techniques described herein relate to an assembly, wherein the electrically conductive layer is disposed on a side of the multi-column GOF assembly configured to contact a heat source.

In some aspects, the techniques described herein relate to an assembly, wherein the electrically conductive layer surrounds at least four sides of the multi-column GOF assembly.

In some aspects, the techniques described herein relate to an assembly, wherein the graphite sheets of the plurality of foam columns are configured conduct heat through the multi-column GOF.

In some aspects, the techniques described herein relate to a system including: a printed circuit board (PCB); a chassis receiving the PCB; a heat source disposed on the PCB; and a multi-column graphite-over-foam (GOF) assembly configured to: press against the heat source, thermally couple the heat source to the chassis, and absorb electromagnetic interference (EMI) from the heat source and conduct the EMI to the chassis.

In some aspects, the techniques described herein relate to a system, wherein the multi-column GOF assembly includes: a plurality of columns, each column of the plurality of columns include a foam core individually wrapped in a graphite sheet; a graphite layer surrounding the plurality of columns; and an electrically conductive outer layer disposed between the graphite layer and the heat source.

In some aspects, the techniques described herein relate to a system, wherein the electrically conductive outer layer and the graphite layer are configured to spread heat received from the heat source to the plurality of columns.

In some aspects, the techniques described herein relate to a system, wherein the plurality of columns are configured to conduct heat through the GOF assembly towards a heatsink of the chassis.

In some aspects, the techniques described herein relate to a system, further including an EMI shield surrounding the heat source, wherein the electrically conductive outer layer is electrically coupled to the EMI shield.

In some aspects, the techniques described herein relate to a system, further including one or more grounds, wherein the electrically conductive layer is electrically coupled to the one or more grounds.

In some aspects, the techniques described herein relate to a system, wherein the one or more grounds include at least one of a plurality of ground pins of the PCB and a ground circuit on a lid of the chassis.

In some aspects, the techniques described herein relate to a method including: compressing a multi-column graphite-over-foam (GOF) assembly between a printed circuit board (PCB) and a housing; conducting heat, via thermally conductive sheets traversing the GOF assembly, from a heat source on the PCB to a heatsink on the housing; absorbing, via an electrically conductive wrap of the GOF assembly, an electromagnetic interference (EMI) emitted by the heat source; and conducting, via the electrically conductive wrap of the GOF assembly, the absorbed EMI to a ground.

In some aspects, the techniques described herein relate to a method, further including spreading, via a graphite wrap of the GOF assembly, the heat from the heat source to the thermally conductive sheets.

In some aspects, the techniques described herein relate to a method, further including electrically coupling the PCB to the housing via the electrically conductive wrap of the GOF assembly.

In some aspects, the techniques described herein relate to a method, wherein the ground includes a plurality of ground pins disposed on the PCB and the compressing includes pressing the multi-column GOF assembly into contact with the plurality of ground pins.

In some aspects, the techniques described herein relate to a method, wherein the ground includes a ground circuit disposed on a lid of the housing and the compressing includes pressing the multi-column GOF assembly into contact the ground circuit.

Each example embodiment disclosed herein has been included to present one or more different features. However, all disclosed example embodiments are designed to work together as part of a single larger system or method. This disclosure explicitly envisions compound embodiments that combine multiple previously-discussed features in different example embodiments into a single system or method.

While the invention has been illustrated and described in detail and with reference to specific embodiments thereof, it is nevertheless not intended to be limited to the details shown, since it will be apparent that various modifications and structural changes may be made therein without departing from the scope of the inventions and within the scope and range of equivalents of the claims. In addition, various features from one of the embodiments may be incorporated into another of the embodiments. Accordingly, it is appropriate that the appended claims be construed broadly and in a manner consistent with the scope of the disclosure as set forth in the following claims.

Reference may be made to the spatial relationships between various components and to the spatial orientation of various aspects of components as depicted in the attached drawings. However, as will be recognized by those skilled in the art after a complete reading of the present disclosure, the devices, components, members, apparatuses, etc. described herein may be positioned in any desired orientation. Thus, the use of terms such as "above," "below," "cupper," "lower," "top," "bottom," or other similar terms to describe a spatial relationship between various components or to describe the spatial orientation of aspects of such components, should be understood to describe a relative relationship between the components or a spatial orientation of aspects of such components, respectively, as the components described herein may be oriented in any desired direction. When used to describe a range of dimensions and/or other characteristics (e.g., time, pressure, temperature, distance, etc.) of an element, operations, conditions, etc., the phrase "between X and Y" represents a range that includes X and Y.

For example, it is to be understood that terms such as "left," "right," "top," "bottom," "front," "rear," "side," "height," "length," "width," "upper," "lower," "interior," "exterior," "inner," "outer" and the like as may be used herein, merely describe points of reference and do not limit the present invention to any particular orientation or configuration. Further, the term "exemplary" is used herein to describe an example or illustration. Any embodiment described herein as exemplary is not to be construed as a preferred or advantageous embodiment, but rather as one example or illustration of a possible embodiment.

Further, the present disclosure may repeat reference numerals and/or letters in the various examples. This repetition is for the purpose of simplicity and clarity and does not in itself dictate a relationship between the various embodiments and/or configurations discussed.

Similarly, when used herein, the term "comprises" and its derivations (such as "comprising," etc.) should not be understood in an excluding sense, that is, these terms should not be interpreted as excluding the possibility that what is described and defined may include further elements, steps, etc. Meanwhile, when used herein, the term "approximately" and terms of its family (such as "approximate," etc.) should be understood as indicating values very near to those which accompany the aforementioned term. That is to say, a deviation within reasonable limits from an exact value should be accepted, because a skilled person in the art will understand that such a deviation from the values indicated is inevitable due to measurement inaccuracies, etc. The same applies to the terms "about" and "around" and "substantially".

As used herein, unless expressly stated to the contrary, use of the phrase "at least one of," "one or more of," "and/or," variations thereof, or the like are open-ended expressions that are both conjunctive and disjunctive in operation for any and all possible combination of the associated listed items. For example, each of the expressions "at least one of X, Y and Z," "at least one of X, Y or Z," "one or more of X, Y and Z," "one or more of X, Y or Z" and "X, Y and/or Z" can mean any of the following: 1) X, but not Y and not Z; 2) Y, but not X and not Z; 3) Z, but not X and not Y; 4) X and Y, but not Z; 5) X and Z, but not Y; 6) Y and Z, but not X; or 7) X, Y, and Z.

Additionally, unless expressly stated to the contrary, the terms "first," "second," "third," etc., are intended to distinguish the particular nouns they modify (e.g., element, condition, node, outlet, inlet, valve, module, activity, operation, etc.). Unless expressly stated to the contrary, the use of these terms is not intended to indicate any type of order, rank, importance, temporal sequence, or hierarchy of the modified noun. For example, "first X" and "second X" are intended to designate two "X" elements that are not necessarily limited by any order, rank, importance, temporal sequence, or hierarchy of the two elements. Further as referred to herein, "at least one of" and "one or more of" can be represented using the "(s)" nomenclature (e.g., one or more element(s)).

What is claimed is:

1. A multi-column graphite-over-foam (GOF) assembly comprising:
    a plurality of foam columns, each foam column of the plurality of foam columns being individually wrapped in a graphite sheet;
    a graphite layer surrounding the plurality of foam columns; and
    an electrically conductive outer layer surrounding the graphite layer,
    wherein the graphite layer thermally couples the electrically conductive outer layer to the plurality of foam columns, and
    wherein the electrically conductive outer layer is exposed to an exterior environment of the multi-column GOF assembly to absorb electromagnetic interference (EMI) and direct heat to the plurality of foam columns via the graphite layer, the multi-column GOF assembly is positioned on a printed circuit board (PCB), and foam columns of the plurality of foam columns are stacked adjacent to one another along a first axis, perpendicular to a second axis along which additional foam columns of an additional plurality of foam columns of an additional multi-column GOF assembly positioned on the PCB are stacked adjacent to one another.

2. The multi-column GOF assembly of claim 1, wherein the electrically conductive outer layer is configured to surround a heat source and electrically couple the PCB to a chassis housing.

3. The multi-column GOF assembly of claim 2, wherein the multi-column GOF assembly is configured to be compressed between the heat source and a lid of the chassis housing.

4. The multi-column GOF assembly of claim 3, wherein the multi-column GOF assembly conducts heat and the EMI from the heat source to the chassis housing.

5. The multi-column GOF assembly of claim 1, wherein the electrically conductive outer layer electrically couples to the PCB through contacts surrounding a heat source and/or an EMI shield surrounding the heat source.

6. The multi-column GOF assembly of claim 1, wherein the electrically conductive outer layer is disposed on a side of the multi-column GOF assembly configured to contact a heat source.

7. The multi-column GOF assembly of claim 1, wherein the electrically conductive outer layer surrounds at least four sides of the multi-column GOF assembly.

8. The multi-column GOF assembly of claim 1, wherein the graphite sheet of each of the plurality of foam columns is configured to conduct heat through the multi-column GOF assembly.

9. The multi-column GOF assembly of claim 2, wherein the electrically conductive outer layer is configured to cover the heat source.

10. The multi-column GOF assembly of claim 2, wherein the electrically conductive outer layer is configured to contact ground pins surrounding the heat source.

11. A system comprising:
    a printed circuit board (PCB);
    a chassis receiving the PCB, the chassis comprising a lid with a plurality of separate, independent grounds disposed thereon;
    a heat source disposed on the PCB; and
    a multi-column graphite-over-foam (GOF) assembly that:
        presses against the heat source to cover and surround the heat source such that the multi-column GOF assembly electrically couples to a plurality of ground pins of the PCB surrounding the heat source,
thermally couples the heat source to the chassis, and
absorbs electromagnetic interference (EMI) from the heat source an conducts the EMI to the chassis,
wherein the lid is coupled to walls of the chassis, and coupling of the lid to the walls of the chassis rotationally aligns a particular ground of the plurality of separate, independent grounds to the multi-column GOF assembly to electrically couple the multi-column GOF assembly to the particular ground.

12. The system of claim 11, wherein the multi-column GOF assembly comprises:
a plurality of columns, each column of the plurality of columns comprising a foam core individually wrapped in a graphite sheet;
a graphite layer surrounding the plurality of columns; and
an electrically conductive outer layer disposed between the graphite layer and the heat source.

13. The system of claim 12, wherein the electrically conductive outer layer and the graphite layer are configured to spread heat received from the heat source to the plurality of columns.

14. The system of claim 12, wherein the plurality of columns are configured to conduct heat through the multi-column GOF assembly towards a heatsink of the chassis.

15. The system of claim 12, further comprising an EMI shield surrounding the heat source, wherein the electrically conductive outer layer is electrically coupled to the EMI shield.

16. The system of claim 11, wherein each ground of the plurality of separate, independent grounds comprises a respective ground circuit.

17. A method comprising:
compressing a first multi-column graphite-over-foam (GOF) assembly between a printed circuit board (PCB) and a housing to cover and surround a heat source on the PCB to electrically couple the first multi-column GOF assembly to a plurality of ground pins surrounding the heat source, wherein the first multi-column GOF assembly comprises a first plurality of foam columns stacked adjacent to one another along a first axis;
compressing a second multi-column GOF assembly between the PCB and the housing to cover and surround an additional heat source on the PCB to electrically couple the second multi-column GOF assembly to an additional plurality of ground pins surrounding the additional heat source, wherein the second multi-column GOF assembly comprises a second plurality of foam columns stacked adjacent to one another along a second axis, perpendicular to the first axis;
conducting heat, via respective thermally conductive sheets traversing the first multi-column GOF assembly and the second multi-column GOF assembly, from the heat source and from the additional heat source on the PCB to a heatsink on the housing;
absorbing, via a respective electrically conductive wrap of the first multi-column GOF assembly and of the second multi-column GOF assembly, an electromagnetic interference (EMI) emitted by the heat source and by the additional heat source; and
conducting, via the respective electrically conductive wrap of the first multi-column GOF assembly and of the second multi-column GOF assembly, the EMI to the plurality of ground pins and to the additional plurality of ground pins.

18. The method of claim 17, further comprising spreading, via a respective graphite wrap of the first multi-column GOF assembly and of the second multi-column GOF assembly, the heat from the heat source and from the additional heat source to the respective thermally conductive sheets.

19. The method of claim 17, further comprising electrically coupling the PCB to the housing via the respective electrically conductive wrap of the first multi-column GOF assembly and of the second multi-column GOF assembly.

20. The method of claim 17, wherein the housing comprises separate, independent, respective ground circuits disposed on a lid of the housing, and the compressing of the first multi-column GOF assembly between the PCB and the housing and the compressing of the second multi-column GOF assembly between the PCB and the housing comprise pressing the first multi-column GOF assembly and the second multi-column GOF assembly into contact with the separate, independent, respective ground circuits.

* * * * *

UNITED STATES PATENT AND TRADEMARK OFFICE
CERTIFICATE OF CORRECTION

| | | |
|---|---|---|
| PATENT NO. | : 12,022,640 B1 | Page 1 of 1 |
| APPLICATION NO. | : 17/840268 | |
| DATED | : June 25, 2024 | |
| INVENTOR(S) | : Phong Hoang Ho et al. | |

It is certified that error appears in the above-identified patent and that said Letters Patent is hereby corrected as shown below:

In the Claims

Claim 11, Column 11, Line 5, please replace "heat source an conducts the EMI to the chassis," with --heat source and conducts the EMI to the chassis,--

Signed and Sealed this
Twenty-second Day of October, 2024

Katherine Kelly Vidal
*Director of the United States Patent and Trademark Office*